(12) United States Patent
Bao et al.

(10) Patent No.: US 10,084,055 B2
(45) Date of Patent: Sep. 25, 2018

(54) UNIFORM THRESHOLD VOLTAGE FOR NANOSHEET DEVICES

(71) Applicant: INTERNATIONAL BUSINESS MACHINES CORPORATION, Armonk, NY (US)

(72) Inventors: Ruqiang Bao, Niskayuna, NY (US); Hemanth Jagannathan, Niskayuna, NY (US); Paul C. Jamison, Rensselaer, NY (US); ChoongHyun Lee, Rensselaer, NY (US); Vijay Narayanan, New York, NY (US); Koji Watanabe, Resnsselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/424,137

(22) Filed: Feb. 3, 2017

(65) Prior Publication Data

US 2018/0226484 A1    Aug. 9, 2018

(51) Int. Cl.
| | |
|---|---|
| *H01L 29/41* | (2006.01) |
| *H01L 29/78* | (2006.01) |
| *H01L 29/10* | (2006.01) |
| *H01L 29/49* | (2006.01) |
| *H01L 29/423* | (2006.01) |
| *H01L 21/28* | (2006.01) |
| *H01L 29/06* | (2006.01) |

(52) U.S. Cl.
CPC .... *H01L 29/4908* (2013.01); *H01L 21/28088* (2013.01); *H01L 29/0673* (2013.01); *H01L 29/42392* (2013.01); *H01L 29/7853* (2013.01)

(58) Field of Classification Search
CPC ............ H01L 29/0669; H01L 29/0673; H01L 29/0665; H01L 29/42392; H01L 2221/1094; H01L 21/02603; H01L 21/0206

See application file for complete search history.

(56) References Cited

U.S. PATENT DOCUMENTS

| | | | |
|---|---|---|---|
| 5,888,867 | A | 3/1999 | Wang et al. |
| 6,680,224 | B2 | 1/2004 | Shin et al. |
| 8,349,695 | B2 | 1/2013 | Scheiper et al. |
| 8,900,984 | B2 | 12/2014 | Nakao et al. |
| 9,006,788 | B2 | 4/2015 | Ko et al. |
| 9,287,357 | B2 | 3/2016 | Rodder et al. |
| 9,293,571 | B2 | 3/2016 | Han et al. |
| 9,418,856 | B2 | 8/2016 | Bordelon et al. |
| 2011/0101470 | A1 | 5/2011 | Hempel et al. |

(Continued)

*Primary Examiner* — David Spalla
(74) *Attorney, Agent, or Firm* — Tutunjian & Bitetto, P.C.; Vazken Alexanian

(57) ABSTRACT

A method is presented for forming a nanosheet structure having a uniform threshold voltage (Vt). The method includes forming a conductive barrier surrounding a nanosheet, forming a first work function conducting layer over the conductive barrier layer, and forming a conducting layer adjacent the first work function conducting layer, the conducting layer defining a first region and a second region. The method further includes forming a second work function conducting layer over the second region of the conducting layer to compensate for threshold voltage offset between the first and second regions of the conducting layer.

20 Claims, 3 Drawing Sheets

(56) References Cited

U.S. PATENT DOCUMENTS

| | | | |
|---|---|---|---|
| 2015/0364546 A1* | 12/2015 | Rodder | H01L 29/1037 257/9 |
| 2016/0020305 A1 | 1/2016 | Obradovic et al. | |
| 2016/0093536 A1* | 3/2016 | Yang | H01L 21/82345 257/392 |
| 2017/0148891 A1* | 5/2017 | Lai | H01L 29/513 |

* cited by examiner

UNIFORM THRESHOLD VOLTAGE FOR NANOSHEET DEVICES

BACKGROUND

Technical Field

The present invention relates generally to semiconductor devices, and more specifically, to achieving uniform threshold voltage for nanosheet devices.

Description of the Related Art

The need to remain cost and performance competitive in the production of semiconductor devices has driven integrated circuits to increased device density. To facilitate the increase in device density, new technologies are constantly needed to allow the feature size of these semiconductor devices to be reduced. The push for ever increasing device densities is particularly strong in complementary metal oxide semiconductors (CMOS) technologies such as in the design and fabrication of field effect transistors (FETs). As semiconductor devices scale to smaller dimensions, nanosheet (nanowire) devices provide advantages. Stacked nanowires provide area efficiency. Stacked nanowires also provide increased drive current within a given layout area.

SUMMARY

In accordance with an embodiment, a method is provided for forming a nanosheet structure having a uniform threshold voltage (Vt). The method includes forming a conductive barrier surrounding a nanosheet, forming a first work function conducting layer over the conductive barrier layer, forming a conducting layer adjacent the first work function conducting layer, the conducting layer defining a first region and a second region, and forming a second work function conducting layer over the second region of the conducting layer to compensate for threshold voltage offset between the first and second regions of the conducting layer.

In accordance with another embodiment, a method is provided for forming a nanosheet structure having a uniform threshold voltage (Vt). The method includes forming a conductive barrier surrounding a nanosheet, forming a work function conducting layer over the first conductive barrier layer, and forming a conducting layer surrounding the work function conducting layer, the work function conducting layer having a thickness greater than the thickness of the conducting layer.

In accordance with another embodiment, a nanosheet structure is provided having a uniform threshold voltage (Vt). The nanosheet structure includes a conductive barrier surrounding a nanosheet, a first work function conducting layer formed over the conductive barrier layer, a conducting layer formed adjacent the first work function conducting layer, the conducting layer defining a first region and a second region, and a second work function conducting layer formed over the second region of the conducting layer to compensate for threshold voltage offset between the first and second regions of the conducting layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
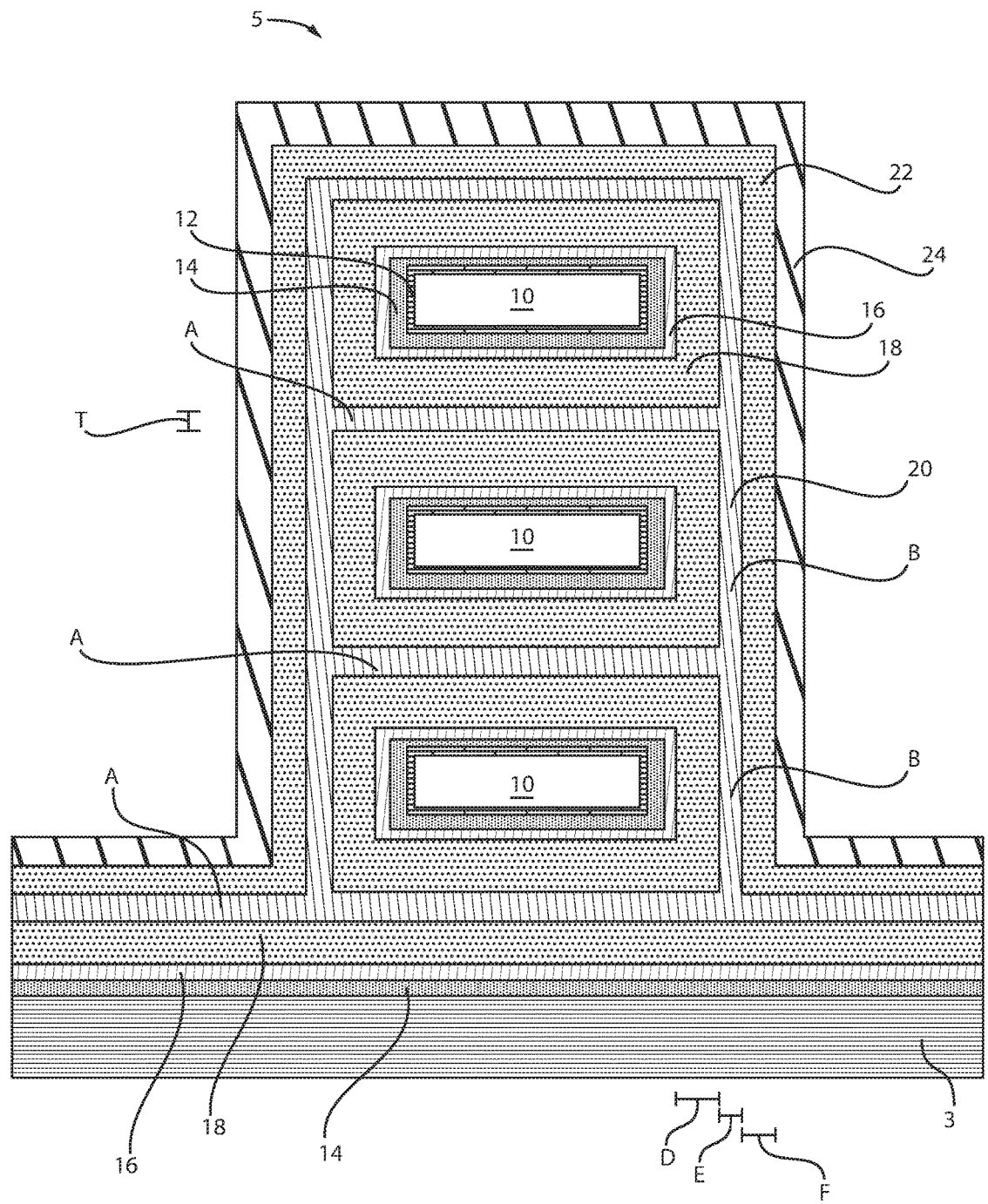
FIG. 1 is a nanosheet structure cross section parallel to the gate, in accordance with an embodiment of the present invention.

Embodiments of the present invention relate generally to the formation of a nanosheet structure. The formation includes forming a conductive barrier surrounding a nanosheet, forming a first work function conducting layer over the conductive barrier layer, forming a conducting layer adjacent the first work function conducting layer, the conducting layer defining a first region and a second region, and forming a second work function conducting layer over the second region of the conducting layer to compensate for threshold voltage offset between the first and second regions of the conducting layer.

Embodiments of the present invention relate generally to the formation of a nanosheet structure. The formation includes forming a conductive barrier surrounding a nanosheet, forming a work function conducting layer over the first conductive barrier layer, and forming a conducting layer surrounding the work function conducting layer, the work function conducting layer having a thickness greater than the thickness of the conducting layer.

Embodiments of the present invention relate generally to the formation of a nanosheet structure. The nanosheet structure includes a conductive barrier surrounding a nanosheet, a first work function conducting layer formed over the conductive barrier layer, a conducting layer formed adjacent the first work function conducting layer, the conducting layer defining a first region and a second region, and a second work function conducting layer formed over the second region of the conducting layer to compensate for threshold voltage offset between the first and second regions of the conducting layer.

In one or more embodiments, titanium nitride (TiN) is used to pinch off the metal between the nanosheet so that no additional work metal function (WFM) is deposited between the nanosheet. Additionally, a second work function metal is used to compensate the threshold voltage (Vt) offset between inner sheets and outer sheets. The second work function metal could be, but not limited to, (e.g., Ti (titanium), Al (aluminum), TaAl (tatanium aluminum), TiAl (titanium aluminum), TaAlC (tatanium aluminum carbon), TiAlC (titanium aluminum carbon)).

In one or more embodiments, a thicker nWFM, such as Ti, Al, TiAl, TaAl, TaAlC, and TiAlC, is used to pinch off between the nanosheet to achieve thicker nWFM on the outside sheet, but thinner nWFM between the inner sheet so that the outer sheet threshold voltage (Vt) and inner sheet threshold voltage (Vt) have a similar or the same Vt.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "over," "overlying," "atop," "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a nanosheet structure cross section parallel to the gate, in accordance with an embodiment of the present invention.

A nanosheet structure 5 includes a substrate 3 and a high-k material 14 deposited thereon. An isolating barrier 16 is formed over the high-k material 14. A work function metal (WFM) 18 can be formed over the isolating barrier 16. The nanosheet structure 5 further includes nanosheets 10. Each nanosheet 10 is surrounded by an inter-level dielectric 12, which in turn is surrounded by the high-k material 14.

The isolating barrier 16 is formed adjacent the high-k material 14 with regard to the nanosheets 10. The isolating barrier 16 can be a metal nitride like titanium nitride (TiN), tantalum nitride (TaN), tungsten nitride (WN), or a carbide like titanium carbide (TiC), tantalum carbide (TaC), and so on. The isolating barrier can be referred to as a conductive barrier. A first work function metal (WFM) 18 is then formed adjacent the isolating barrier 16. A second isolating barrier 20 can be formed adjacent the first WFM 18. The second isolating barrier 20 can be a metal nitride like titanium nitride (TiN), tantalum nitride (TaN), tungsten nitride (WN), or a carbide like titanium carbide (TiC), tantalum carbide (TaC), and so on. The isolating barrier can be referred to as a conductive barrier. A second work function metal (WFM) 22 can then be formed adjacent the second isolating barrier 20. The first and second WFMs 18, 22 can be Ti, Al, TiAl, TaAl, TaAlC, and TiAlC. In one embodiment, the first and second WFMs 18, 22 can be the same material. In another embodiment, the first and second WFMs 18, 22 can be different materials. Finally, a conducting layer 24 is formed over the second WFM 22. The conducting layer 24 can be a metal nitride like titanium nitride (TiN), tantalum nitride (TaN), tungsten nitride (WN), or a carbide like titanium carbide (TiC), tantalum carbide (TaC), and so on or a pure metal like nickel (Ni) or tungsten (W). In one embodiment, the isolating barrier 16, the second isolating barrier 20, and the conducting layer 24 could be same material. In another embodiment, the isolating barrier 16, the second isolating barrier 20, and the conducting layer 24 could be different materials.

The thickness of the first WFM 18 can be designated as "D," whereas the thickness of the second WFM 22 can be designated as "F." In one example embodiment, the thickness "D" of the first WFM 18 can be greater than the thickness "F" of the second WFM 22. The thickness "E" of the second isolating barrier 20 can be less than the thickness of the first and second WFMs 18, 22. In another embodiment, the thickness "E" of the second isolating barrier 20 can be thicker than the first and second WFMs 18, 22. The second isolating barrier 20 is formed between the first and second WFMs 18, 22. The second isolating barrier 20 can also be referred to as a conducting layer.

The second isolating barrier 20 can define first regions "A" and second regions "B." First regions "A" are parallel to each other and separate the nanosheets 10 from each other. First regions "A" can have a thickness designated by "T." The thickness of the first regions "A" can be thinner or thicker than the thickness "E" of the second regions "B." The maximum thickness of the first regions "A" can be double the thickness "E" of the second regions "B," depending on the sheet distance between the nanosheets 10. The first regions "A" can be referred to as inner sheets, whereas the second regions "B" can be referred to as outer sheets.

The nanosheet structure 5 is designed such that the threshold voltage (Vt) of the inner sheets can be approximately equal to the Vt of the outer sheets. The effective work function in the first region A is approximately equal to the effective work function in the second region B. This is achieved by forming the second isolating barrier 20 between the first and second work function metals 18, 22. The second isolating barrier 20 pinches off the metal between the nanosheets 10 such that no additional WFM is deposited between the nanosheets 10. Instead, the second WFM 22 is used to compensate the Vt offset between the inner sheets and the outer sheets. Thus, a higher WFM 18, such as TiN, can provide a pinch off between the inner sheets and an additional WFM 22 can be deposited around the outer sheets to achieve the same Vt between the inner and outer sheets.

In one or more embodiments, the substrate 3 can be a semiconductor or an insulator with an active surface semiconductor layer. The substrate 3 can be crystalline, semi-crystalline, microcrystalline, or amorphous. The substrate 3 can be essentially (i.e., except for contaminants) a single element (e.g., silicon), primarily (i.e., with doping) of a single element, for example, silicon (Si) or germanium (Ge), or the substrate 3 can include a compound, for example, $Al_2O_3$, $SiO_2$, GaAs, SiC, or SiGe. The substrate 3 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 3 can also have other layers forming the substrate 3, including high-k oxides and/or nitrides. In one or more embodiments, the substrate 3 can be a silicon wafer. In an embodiment, the substrate 3 is a single crystal silicon wafer.

In one or more embodiments, the interfacial layer (IL)12 can have a thickness in the range of about 5 A to 3 nm.

The IL 12 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides. The formation of IL12 could be achieved by wet chemicals, dry oxidation, or nitridation.

In various embodiments, the IL 12 can be bilayers like $SiO_2/Si_2N_3$, or $SiO_2/Al_2O_3$ if III-V nanosheet channel (10) is used.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

The type of work function metal(s) 18, 22 depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

A conductive metal 16 is deposited over the high-k dielectric material(s) 14 and a conductive metal 20 is deposited adjacent the workfunction layer(s) 18, 22 to form the gate stacks. Non-limiting examples of suitable conductive metals include aluminum (Al), platinum (Pt), gold (Au), tungsten (W), titanium (Ti), or any combination thereof. The conductive metal can be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal and form the gate stack.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 2:
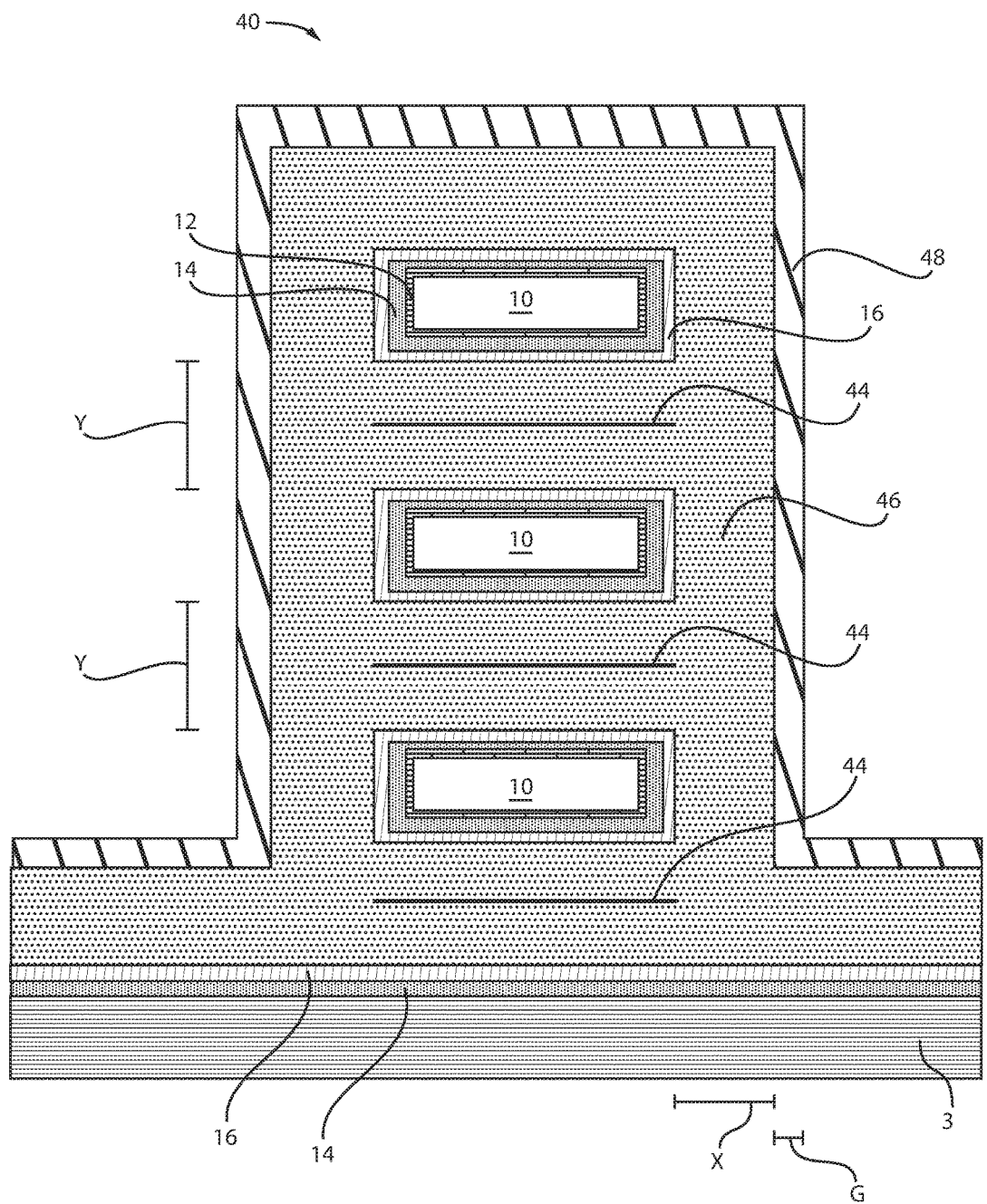
FIG. 2 is a nanosheet structure cross section parallel to the gate, in accordance with another embodiment of the present invention.

FIG. 2 is a nanosheet structure cross section parallel to the gate, in accordance with another embodiment of the present invention.

A nanosheet structure 40 includes a substrate 3 with a high-k material 14 deposited thereon. An isolating barrier is formed over the high-k material 14. The nanosheet structure 40 further includes nanosheets 10. Each nanosheet 10 is surrounded by an inter-level dielectric 12, which in turn is surrounded by the high-k material 14, as in FIG. 1. The nanosheets 10 are separated from each other by a distance "Y."

The isolating barrier 16 is formed adjacent the high-k material 14 with respect to the nanosheets 10. The isolating barrier 16 can be a metal nitride like titanium nitride (TiN), tantalum nitride (TaN), tungsten nitride (WN), or a carbide like titanium carbide (TiC), tantalum carbide (TaC), and so on. The isolating barrier 16 can be referred to as a conductive barrier. A work function metal (WFM) 46 is then formed adjacent the isolating barrier 16. The WFM 46 can be, Ti, Al, TiAl, TaAl, TaAlC, and TiAlC. A conducting layer 48 is then formed over the WFM 46. The conducting layer 48 can be a metal nitride like titanium nitride (TiN), tantalum nitride (TaN), tungsten nitride (WN), or a carbide like titanium carbide (TiC), tantalum carbide (TaC), and so on or a pure metal like nickel (N) or tungsten (W). Additionally, seams 44 can be formed between the nanosheets 10 due to, e.g., ALD (atomic layer deposition).

The thickness of the of the WFM 46 can be designated as "X." The thickness of the conducting layer 48 can be designated as "G." In one embodiment, the thickness of the WFM 46 is greater than the thickness of the conducting layer 48. In one example, the thickness of the WFM 46 is more than twice the thickness of the conducting layer 48. A thicker nWFM, such as Ti, Al, TiAl, TaAl, TaAlC, and TiAlC, is used to pinch off between the nanosheet to achieve thicker nWFM on the outside so that the outer sheet threshold voltage (Vt) and inner sheet threshold voltage (Vt) have a similar or the same or uniform Vt. The thickness of the inner sheet can be designated as "Y." In one embodiment, Y could be larger than X.

Therefore, in contrast to FIG. 1, the nanosheet structure 40 in FIG. 2 includes a single thick WFM 46 that surrounds the isolating barrier 16, which in turn surrounds the nanosheets 10. The single WFM 46 is then surrounded by a TiN layer 48 that enables the uniform Vt to be achieved for the inner and outer sheets.

Although three vertically stacked channel patterns are illustrated in FIGS. 1 and 2, more vertically stacked channel patterns can be provided. For example, in some embodiments, the plurality of vertically stacked channel patterns can include four or more vertically stacked channel patterns. Although each of the vertically stacked channel patterns illustrated in FIGS. 1 and 2 include three nanosheets 10, a greater or lesser number of nanosheets 10 can be provided. For example, in some embodiments, one of the plurality of vertically stacked channel patterns can include four or more nanosheets 10. In some embodiments, one of the plurality of vertically stacked channel patterns can include only two nanosheets 10.

One of the nanosheets 10 can include a thin layer of conducting channel material. For example, in some embodiments, one of the nanosheets 10 can include Si, SiGe, Ge, and/or a group III-V semiconductor material, for example InGaAs, InAs, or InSb, but the inventive concept is not limited thereto. In some embodiments, a width of one of the plurality of nanosheets 10 can be in a range of about 10 nm to about 30 nm in a first direction that is parallel to the surface of the substrate 3. In some embodiments, a thickness of one of the plurality of nanosheets can be in a range of about 2 nm to about 8 nm in a second direction that is perpendicular to the surface of the substrate 3. In some embodiments, a thickness of one of the plurality of nanosheets can be in a range of about 3 nm to about 6 nm in the second direction that is perpendicular to the surface of the substrate 3.

In some embodiments, a ratio of the width of the one of the plurality of nanosheets 10 to the thickness of the one of the plurality of nanosheets 10 can be at least 1:1. In some embodiments, a ratio of the width of the one of the plurality of nanosheets 10 to the thickness of the one of the plurality of nanosheets 10 can be at least 2:1. In some embodiments, a ratio of the width of the one of the plurality of nanosheets 10 to the thickness of the one of the plurality of nanosheets 10 can be at least 3:1.

In some embodiments, the stacked nanosheet FET semiconductor device can include an n-type FET and/or a p-type FET. In sonic embodiments, a stacked nanosheet FET semiconductor device can include more than one stacked nanosheet FET. In some embodiments, the top and bottom surfaces of the nanosheets 10 of the n-type stacked nanosheet FET can have a first surface orientation and the top and bottom surfaces of the nanosheets 10 of the p-type stacked nanosheet FET can have a second surface orientation. The first surface orientation can be the same as the second surface orientation, and/or can be different. For example, in some embodiments, the first surface orientation and the second surface orientation can each be (110). In some embodiments, the first surface orientation can be (100) or (111) and the second orientation can be (110). In some embodiments, the nanosheets can include Si and/or Ge and the first surface orientation and the second surface orientation can each be (110). In some embodiments, the nanosheets can include Si and the first surface orientation can be (100) and the second orientation can be (110). In some embodiments, the nanosheets can include Ge and the first surface orientation can be (111) and the second orientation can be (110).

Figure 3:
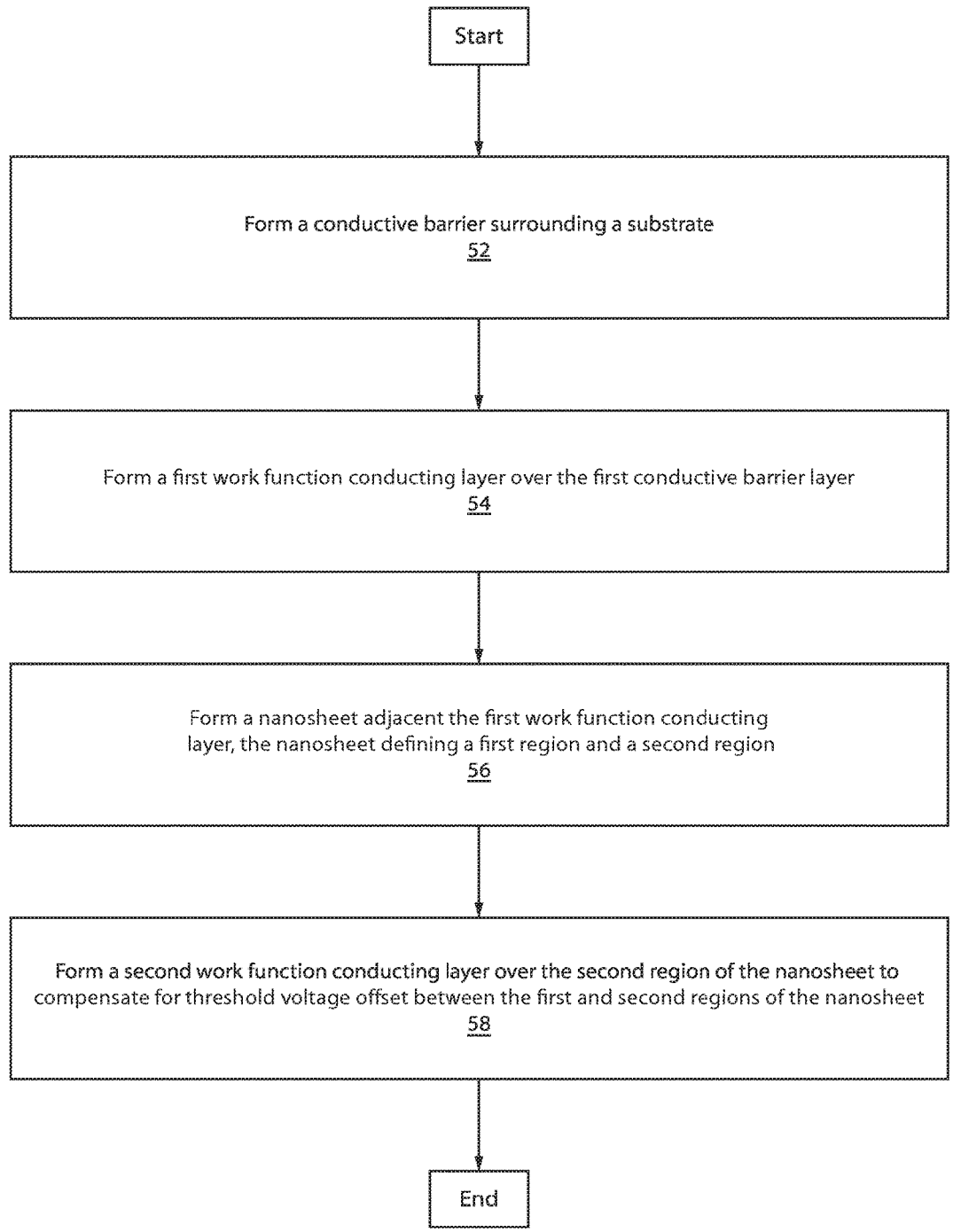
FIG. 3 is a block/flow diagram of an exemplary method for forming a nanosheet structure having a uniform threshold voltage (Vt), in accordance with an embodiment of the present invention.

FIG. 3 is a block/flow diagram of an exemplary method for forming a nanosheet structure having a uniform threshold voltage (Vt), in accordance with an embodiment of the present invention.

At block 52, a conductive barrier is formed surrounding a substrate.

At block 54, a first work function conducting layer is formed over the first conductive barrier layer.

At block 56, a nanosheet is formed adjacent the first work function conducting layer, the nanosheet defining a first region and a second region.

At block 58, a second work function conducting layer is formed over the second region of the nanosheet to compensate for threshold voltage offset between the first and second regions of the nanosheet.

The methods can include patterning and etching the stacked layers into desired dimensions, defining the width of one of the plurality of nanosheets 10 and the horizontal spacing distance between adjacent one of the plurality of nanosheets 10. In some embodiments, the patterning and etching of the stacked layers can define a length of the plurality of nanosheets 10. A single mask step and etch step, and/or multiple mask steps and etch steps, can be used to define the width of one of the plurality of nanosheets 10 and the horizontal spacing distance between adjacent one of the plurality of nanosheets 10 in each horizontal plane. An etch, for example a dry etch, that is not selective to either of the conduction channel material and/or the sacrificial conduction material can be utilized, although a multiple-etch process, using different etch gas chemistries to selectively etch each of the conduction channel material and sacrificial conduction material can also be utilized.

The methods can include processes including, for example, dummy gate formation, external and/or internal spacer formation, dielectric material deposition, dummy gate removal, and/or sacrificial conduction material removal. In some embodiments, the sacrificial conduction material can be removed by a wet etch process and/or a combination wet/dry etch process. The resultant conduction channel nanosheets 10 can be supported by the spacers remaining alter the dummy gate removal. After the dummy gate removal, the resultant conduction channel nanosheets 10 can define the final horizontal spacing distance and vertical spacing distance.

In some embodiments, the methods can include epitaxial growth from a starting material on an insulator and a separate epitaxial growth from a bulk substrate to form nanosheets including channel materials not of the same group, for example group IV and group III-V semiconductor materials, and/or not of the same surface orientation.

The methods can include forming the stacked nanosheet FET (field effect transistor) semiconductor device and/or a circuit including nanosheet FETs by processes including, for example, CMP (chemical mechanical planarization) steps to enable gate metal only in the removed dummy gate regions, contact formation, and/or BEOL (back end of the line) formation.

In some embodiments, a width of the plurality of nanosheets can be in a range of about 10 nm to about 30 nm in a first direction that is parallel to the surface of the substrate 3. In some embodiments, a thickness of the plurality of nanosheets can be in a range of about 2 nm to about 8 nm in a second direction that is perpendicular to the surface of the substrate 3. In some embodiments, a thickness of one of the plurality of nanosheets can be in a range of about 3 nm to about 6 nm in the second direction that is perpendicular to the surface of the substrate 3.

The nanosheets can include a thin layer of conducting channel material. For example, in some embodiments, one or more of the nanosheets can include Si, SiGe, Ge, and/or a Group III-V semiconductor material, for example InGaAs, but the inventive concept is not limited thereto. The term "Si nanosheet FET" refers to nanosheet FETs with nanosheets including Si or including a large percentage of Si, for example $Si_xGe_{1-x}$, where x is greater than about 0.3. The term "non-Si nanosheet FET" refers to nanosheet FETs with nanosheets not including Si, for example InGaAs, or including a small percentage of Si, for example $Si_yGe_{1-y}$, where y is less than about 0.3.

A non-Si nanosheet FET can have a higher channel carrier mobility than an equivalent Si nanosheet FET. The higher channel carrier mobility can result in higher performance. However, the non-Si nanosheet FET can also have higher band-to-band tunneling (BTBT) leakage current than the equivalent Si nanosheet FET. In general, high BTBT leakage current can occur in the same device design range as high channel carrier mobility. Several factors can induce higher BTBT leakage current in a non-Si nanosheet FET. For example, a parasitic-bipolar-effect (PBE) can effectively multiply a BTBT leakage current by a large value for non-Si nanosheet FETs with nanosheets including $Si_yGe_{1-y}$, where y is less than about 0.3, to result in a net BTBT-induced leakage current that is significantly high.

The methods described with respect to FIGS. 1 and 2 can include different masking and etching processes. Masking and etching can include patterning and etching the stacked layers into desired dimensions to define the width of each nanosheet and horizontal spacing between each nanosheet, in each horizontal plane. In some embodiments, the length of each nanosheet can also be defined within this action but, in some embodiments, can be defined at another action. A single mask and etch, or multiple masks and etches, can be used to define the width and spacing between each nanosheet, in each horizontal plane. In some embodiments, an etch, for example a dry etch, that is not selective to either of the conduction channel material or sacrificial material can be utilized. In some embodiments, a multiple-etch process using different etch gas chemistries to selectively etch each of the conduction channel material and sacrificial material can be utilized. The methods can include forming dummy gates (not shown), forming spacers (not shown), depositing dielectric material (not shown), removing dummy gates (not shown), and removing sacrificial material (not shown).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element could be termed a second element without departing from the scope of the present concept.

Having described preferred embodiments of a method of device fabrication and a semiconductor device thereby fabricated (which are intended to be illustrative and not limiting) for achieving a uniform threshold voltage for a nanosheet device, it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a nanosheet structure having a uniform threshold voltage (Vt), the method comprising:
   forming a conductive barrier surrounding a nanosheet structure including a plurality of nanosheets;
   forming a first work function conducting layer over the conductive barrier;
   forming a conducting layer surrounding the first work function conducting layer, the conducting layer defining a first region and a second region being different than the first region; and
   forming a second work function conducting layer around the nanosheet structure including the plurality of nanosheets and over the second region of the conducting layer to obtain a same threshold voltage for the first and second regions of the conducting layer.

2. The method of claim 1, wherein the conductive barrier is composed of a metal nitride, such as titanium nitride (TiN), tantalum nitride (TaN), or tungsten nitride (WN), or a carbide, such as titanium carbide (TiC) or tantalum carbide (TaC).

3. The method of claim 1, wherein the conducting layer can be a nitride, such as titanium nitride (TiN), tantalum nitride (TaN), or tungsten nitride (WN), or a carbide, such as titanium carbide (TiC) or tantalum carbide (TaC).

4. The method of claim 3, wherein the first and second work function conducting layers are one of Ti (titanium), Al (aluminum), TaAl (tatanium aluminum), TiAl (titanium aluminum), TaAlC (tatanium aluminum carbon), and TiAlC (titanium aluminum carbon)) or combination of them.

5. The method of claim 4, wherein the second work function conducting layer is surrounded by a conducting layer such as a metal nitride like titanium nitride (TiN), tantalum nitride (TaN), or tungsten nitride (WN), or a carbide like titanium carbide (TiC) or tantalum carbide (TaC), or a pure metal like nickel (N) or tungsten (W).

6. The method of claim 1, wherein an interfacial layer (IL) is grown between the nanosheet structure and the conductive barrier.

7. The method of claim 6, wherein a high-k material is deposited between the IL and the conductive barrier.

8. The method of claim 1, wherein a thickness of the first region of the conducting layer is thinner or thicker than the second region of the conducting layer, but the thickness of the first region is not thicker than a double thickness of the second region of the conducting layer.

9. A method of forming a nanosheet structure having a uniform threshold voltage (Vt), the method comprising:
   forming a conductive barrier surrounding a nanosheet structure including a plurality of nanosheets;
   forming a first work function conducting layer over the conductive barrier; and
   forming a conducting layer defining an inner sheet and an outer sheet having a uniform threshold voltage within a second work function conducting layer defined around the nanosheet structure including the plurality of nanosheets, the conducting layer surrounding the first work function conducting layer, the first work function conducting layer having a thickness greater than a thickness of the conducting layer.

10. The method of claim 9, wherein the conductive barrier is a metal nitride, such as titanium nitride (TiN), tantalum nitride (TaN), or tungsten nitride (WN), or a carbide, such as titanium carbide (TiC) or tantalum carbide (TaC).

11. The method of claim 9, wherein the first work function conducting layer is one of Ti (titanium), Al (aluminum), TaAl (tatanium aluminum), TiAl (titanium aluminum), TaAlC (tatanium aluminum carbon), and TiAlC (titanium aluminum carbon)) or combination of them.

12. The method of claim 9, wherein the conducting layer surrounding the first work function conducting layer is a metal nitride like titanium nitride (TiN), tantalum nitride (TaN), or tungsten nitride (WN), or a carbide like titanium carbide (TiC) or tantalum carbide (TaC), or a pure metal like nickel (N) or tungsten (W).

13. The method of claim 9, wherein an IL is grown between the nanosheet structure and the conductive barrier.

14. The method of claim 13, wherein a high-k material is deposited between the IL and the conductive barrier.

15. A nanosheet structure having a uniform threshold voltage (Vt), the structure comprising:
   a conductive barrier surrounding a nanosheet structure including a plurality of nanosheets;
   a first work function conducting layer formed over the conductive barrier;
   a conducting layer surrounding the first work function conducting layer, the conducting layer defining a first region and a second region being different than the first region; and
   a second work function conducting layer formed around the nanosheet structure including the plurality of nanosheets and over the second region of the conducting layer to obtain a same threshold voltage for the first and second regions of the conducting layer.

16. The structure of claim 15, wherein the first and second work function conducting layers are nWFMs, such as Ti (titanium), Al (aluminum), TaAl (tatanium aluminum), TiAl (titanium aluminum), TaAlC (tatanium aluminum carbon), and TiAlC (titanium aluminum carbon)) or combination of them.

17. The structure of claim 15, wherein the second work function conducting layer is surrounded by a conductive barrier, such as a metal nitride like titanium nitride (TiN), tantalum nitride (TaN), tungsten nitride (WN), or a carbide like titanium carbide (TiC) or tantalum carbide (TaC).

18. The structure of claim 15, wherein an IL is grown between the nanosheet structure and the conductive barrier.

19. The structure of claim 18, wherein a high-k material is deposited between the IL and the conductive barrier.

20. The structure of claim 15, wherein a thickness of the first region of the conducting layer is thinner or thicker than the second region of the conducting layer, but the thickness of the first region is not thicker than a double thickness of the second region of the conducting layer.

* * * * *